(12) United States Patent
Lu et al.

(10) Patent No.: US 10,389,266 B2
(45) Date of Patent: Aug. 20, 2019

(54) RECTIFICATION MODULE

(71) Applicant: Delta Electronics (Thailand) Public Company Limited, Samutprakarn (TH)

(72) Inventors: Hao Lu, Samutprakarn (TH); Tianding Hong, Samutprakarn (TH); Bofeng Xu, Samutprakarn (TH); Jie Ruan, Samutprakarn (TH); Jinfa Zhang, Samutprakarn (TH)

(73) Assignee: DELTA ELECTRONICS (THAILAND) PUBLIC COMPANY LIMITED, Samutprakarn (TW)

( * ) Notice: Subject to any disclaimer, the term of this patent is extended or adjusted under 35 U.S.C. 154(b) by 0 days.

(21) Appl. No.: 16/024,793

(22) Filed: Jun. 30, 2018

(65) Prior Publication Data
US 2019/0140551 A1 May 9, 2019

(30) Foreign Application Priority Data
Nov. 8, 2017 (CN) .................. 2017 2 1482301 U (51) Int. Cl.
*H05K 1/00* (2006.01)
*H02M 7/00* (2006.01)
(Continued)

(52) U.S. Cl.
CPC .......... *H02M 7/003* (2013.01); *H05K 1/0242* (2013.01); *H05K 1/141* (2013.01);
(Continued)

(58) Field of Classification Search
CPC .......... H01F 27/40; H01F 27/24; H01F 27/28; H02M 7/003; H05K 1/14; H05K 2201/1003; H05K 1/0242; H05K 1/141; H05K 1/0263; H05K 2201/09045; H05K 2201/09909; H05K 2201/1027
See application file for complete search history.

(56) References Cited

U.S. PATENT DOCUMENTS

2013/0077276 A1* 3/2013 Kippley .................. H02M 3/00
361/784
2013/0188329 A1* 7/2013 Chang ...................... H05K 1/18
361/836

(Continued)

*Primary Examiner* — Pete T Lee
(74) *Attorney, Agent, or Firm* — Kirton McConkie; Evan R. Witt (57) ABSTRACT

A rectification module includes a transformer, a connecting unit and a rectification unit. The transformer includes a first lateral region, a second lateral region and at least one secondary winding assembly. The second lateral region is located beside the first lateral region. The secondary winding assembly includes plural outlet ends. The plural outlet ends are arranged near the first lateral region. The connecting unit is located at the first lateral region, and includes plural conducting plates. Each of the conducting plates includes at least one opening and at least one connecting structure. The conducting plates are partially or completely stacked on each other. The outlet ends are accommodated within the corresponding openings. The conducting plates are fixed on the first lateral region. The connecting structures face the second lateral region. The rectification unit includes a circuit board and plural rectifier components.

26 Claims, 9 Drawing Sheets

(51) Int. Cl.
*H05K 1/14* (2006.01)
*H05K 1/02* (2006.01)
*H02M 1/00* (2006.01)

(52) U.S. Cl.
CPC ... *H02M 2001/0048* (2013.01); *H05K 1/0263* (2013.01); *H05K 2201/09045* (2013.01); *H05K 2201/09909* (2013.01); *H05K 2201/1003* (2013.01); *H05K 2201/10272* (2013.01)

(56) References Cited

U.S. PATENT DOCUMENTS

2014/0327511 A1* 11/2014 Tsai .................. H01F 27/28
    336/220
2016/0035477 A1   2/2016 Yeh et al.

* cited by examiner

RECTIFICATION MODULE

FIELD OF THE INVENTION

The present invention relates to a rectification module, and more particularly to a rectification module with reduced volume and enhanced efficiency.

BACKGROUND OF THE INVENTION

Nowadays switching power supply is widely used to provide source for electronic equipment. High efficiency and high power density are the two trends for switching power supply. To achieve high power density and high efficiency, a synchronous rectification module is used, especially for low-voltage and large-current applications. Generally, the synchronous rectification module comprises a transformer, a connecting unit and a rectification unit. The rectification unit comprises at least one diode or one synchronous rectifier unit. The connecting unit is needed to transmit electric energy from the transformer to the rectification unit. Since current through the rectification module is high frequency alternating current, for high power and current application, there will be significant AC conduction power loss due to skin effect and proximity effect, especially on the connecting unit. That will cause bad efficiency and thermal problem.

Therefore, there is a need of providing an improved synchronous rectification module with high efficiency by reducing AC conduction loss.

SUMMARY OF THE INVENTION

An object of the present invention provides a rectification module. The rectification module includes a transformer, a connecting unit and a rectification unit. The connecting unit and the rectification unit are disposed on the periphery regions of the transformer. Moreover, plural conducting plates of the connecting unit are partially or completely stacked on each other. Since the AC impedance of the connecting unit is decreased, the efficiency of the rectification module is enhanced.

In accordance with an aspect of the present invention, there is provided a rectification module. The rectification module includes a transformer, a connecting unit. The transformer includes a first lateral region, a second lateral region and at least one secondary winding assembly. The second lateral region is located beside the first lateral region. The secondary winding assembly includes plural outlet ends. The plural outlet ends are arranged near the first lateral region. The connecting unit is located at the first lateral region, and includes a first conducting plate and a second conducting plate. The first conducting plate includes at least one first opening and at least one first connecting structure. The corresponding outlet end is accommodated within the first opening. At least a portion of the second conducting plate and at least a portion of the first conducting plate are stacked on each other. The second conducting plate includes at least one second opening and at least one second connecting structure. The corresponding outlet end is accommodated within the second opening. The first conducting plate and the second conducting plate are fixed on the first lateral region. The first conducting plate and the second conducting plate are isolated from each other. The first connecting structure and the second connecting structure face the second lateral region.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
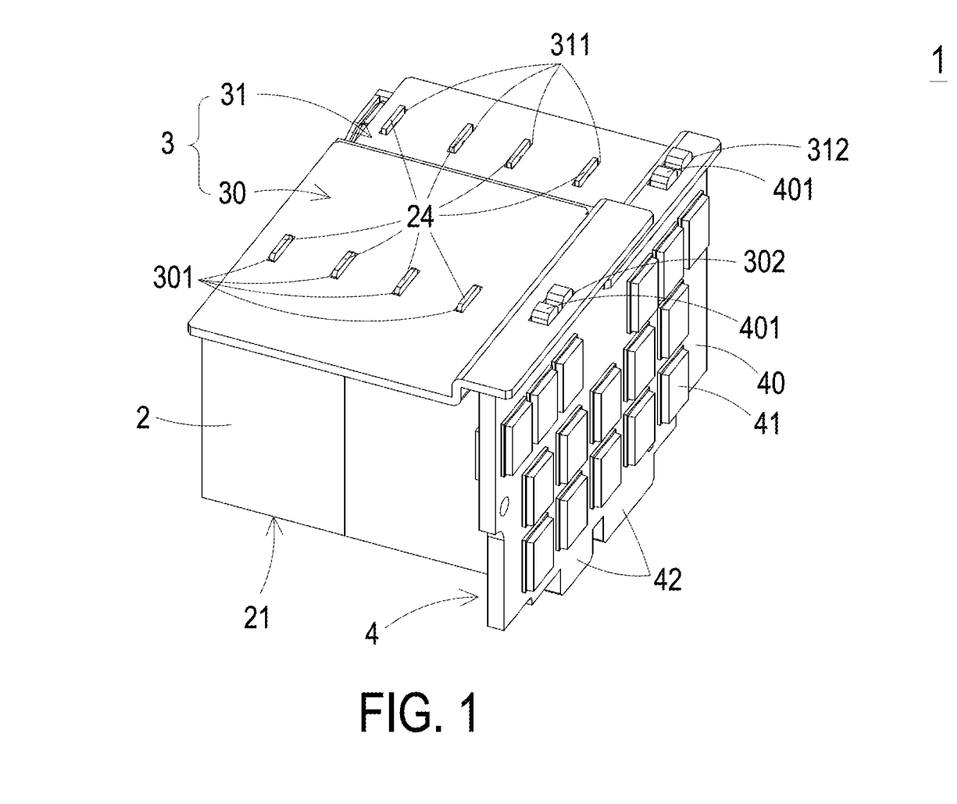
FIG. 1 is a schematic perspective view illustrating a rectification module according to a first embodiment of the present invention.
Figure 2:
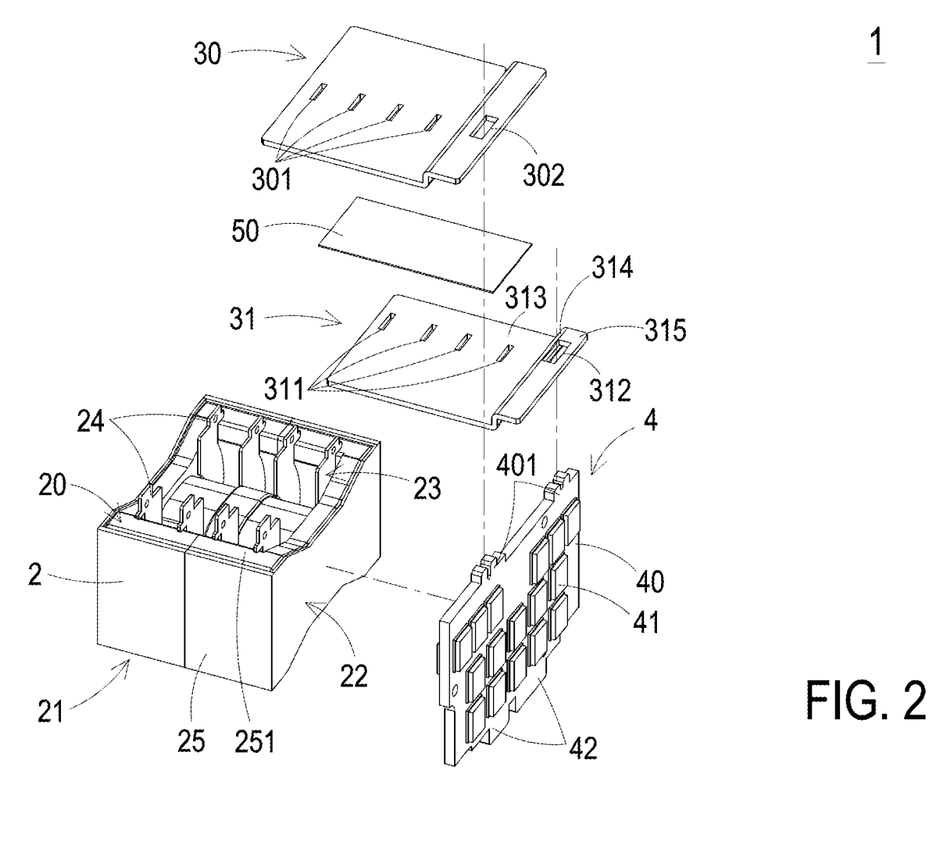
FIG. 2 is a schematic exploded view illustrating the rectification module of FIG. 1.

FIG. 1 is a schematic perspective view illustrating a rectification module according to a first embodiment of the present invention. FIG. 2 is a schematic exploded view illustrating the rectification module of FIG. 1. The rectification module 1 is installed on a main board (not shown). In this embodiment, the rectification module 1 comprises a transformer 2, a connecting unit 3 and a rectification unit 4.

The transformer 2 comprises a first lateral region 20, a second lateral region 22 and a third lateral region 21. The first lateral region 20 and the third lateral region 21 are opposed to each other. The second lateral region 22 is located beside the first lateral region 20 and arranged between the first lateral region 20 and the third lateral region 21. The transformer 2 further comprises a magnetic core assembly 25, a primary winding assembly (not shown) and at least one secondary winding assembly 23. The primary winding assembly is partially accommodated within the magnetic core assembly 25 to receive the input electric energy. The at least one secondary winding assembly 23 is partially accommodated within the magnetic core assembly 25. After the input electric energy from the primary winding assembly is received by the secondary winding assembly 23, the input electric energy is converted into output electric energy. The secondary winding assembly 23 comprises plural outlet ends 24. The plural outlet ends 24 are arranged near the first lateral region 20. The plural outlet ends 24 are used as the output terminals of the secondary winding assembly 23. Consequently, the output electric energy from the transformer 2 is outputted from the outlet ends 24. Moreover, the magnetic core assembly 25 comprises a window 251. The plural outlet ends 24 of the secondary winding assembly 23 are protruded out of the window 251 and arranged near the first lateral region 20.

The connecting unit 3 is located at the first lateral region 20. The connecting unit 3 comprises a first conducting plate 30 and a second conducting plate 31. The first conducting plate 30 is located at the first lateral region 20. Moreover, the first conducting plate 30 comprises at least one first opening 301 and at least one first connecting structure 302. Preferably, the first conducting plate 30 comprises plural first openings 301. The outlet ends 24 of the secondary winding assembly 23 are received within the corresponding first openings 301 and electrically connected with the first conducting plate 30. The second conducting plate 31 is located at the first lateral region 20 of the transformer 2. Moreover, the second conducting plate 31 is arranged between the first conducting plate 30 and the transformer 2. At least a portion of the second conducting plate 31 and at least a portion of the first conducting plate 30 are stacked on each other. The second conducting plate 31 comprises at least one second opening 311 and at least one second connecting structure 312. Preferably, the second conducting plate 31 comprises plural second openings 311. The outlet ends 24 of the secondary winding assembly 23 are received within the corresponding second openings 311 and electrically connected with the second conducting plate 31. Consequently, the first conducting plate 30 and the second conducting plate 31 are fixed on the first lateral region 20. Moreover, the first conducting plate 30 and the second conducting plate 31 are isolated from each other. The first connecting structure 302 and the second connecting structure 312 face the second lateral region 22 of the transformer 2. Preferably, the first connecting structure 302 and the second connecting structure 312 are copper bus bars. Alternatively, the first connecting structure 302 and the second connecting structure 312 are integrally formed into one piece by a copper bus bar (not shown).

The rectification unit 4 comprises a circuit board 40 and plural rectifier components 41. The circuit board 40 comprises plural third connecting structures 401. The plural third connecting structures 401 are arranged beside the first lateral region 20 of the transformer 2. The plural third connecting structures 401 are connected with the first connecting structure 302 of the first conducting plate 30 and the second connecting structure 312 of the second conducting plate 31, respectively. Consequently, the circuit board 40 is fixed on the second lateral region 22 of the transformer 2. The third connecting structures 401 is electrically connected with the first conducting plate 30 through the first connecting structure 302 and electrically connected with the second conducting plate 31 through the second connecting structure 312. The rectifier components 41 are installed on the circuit board 40 and electrically connected with the third connecting structures 401. After the output electric energy from the plural outlet ends 24 of the secondary winding assembly 23 are transmitted to the first conducting plate 30 and the second conducting plate 31, the output electric energy is transmitted to the rectifier components 41 through the third connecting structures 401. The rectifier components 41 are used for rectification.

In the rectification module 1, the connecting unit 3 is located at the first lateral region 20 of the transformer 2. The connecting unit 3 is electrically connected with the rectification unit 4 and the transformer 2. Moreover, the rectification unit 4 is fixed on the second lateral region 22 of the transformer 2 with the assistance of the connecting unit 3. In other words, the connecting unit 3 and the rectification unit 4 are disposed on the periphery regions of the transformer 2. Consequently, the transformer 2, the connecting unit 3 and the rectification unit 4 are combined as an integrated structure. As mentioned above, the connecting unit, the transformer and the rectification unit of the conventional rectification module are individually and separately disposed on the main board. When compared with the conventional rectification module, the volume of the rectification module 1 of the present invention is smaller. Moreover, when the rectification module 1 of the present invention is installed on the main board, the power density of the main board is enhanced.

Moreover, the rectification module 1 further comprises a first insulation component 50. The first insulation component 50 is arranged between the first conducting plate 30 and the second conducting plate 31. Consequently, the first conducting plate 30 and the second conducting plate 31 are isolated from each other through the first insulation component 50. In an embodiment, the first insulation component 50 is aligned with the stacked position between the first conducting plate 30 and the second conducting plate 31. Moreover, the first conducting plate 30, the first insulation component 50 and the second conducting plate 31 are combined together through a gluing medium.

In an embodiment, the first connecting structure 302 and the second connecting structure 312 are slots, and the third connecting structures 401 are bulges. After the first connecting structure 302 and the second connecting structure 312 are engaged with the corresponding third connecting structures 401, the circuit board 40 and the connecting unit 3 are combined together. In another embodiment, the first connecting structure 302 and the second connecting structure 312 are bulges, and the third connecting structures 401 are slots. Similarly, after the first connecting structure 302 and the second connecting structure 312 are engaged with the corresponding third connecting structures 401, the circuit board 40 and the connecting unit 3 are combined together.

Figure 3:
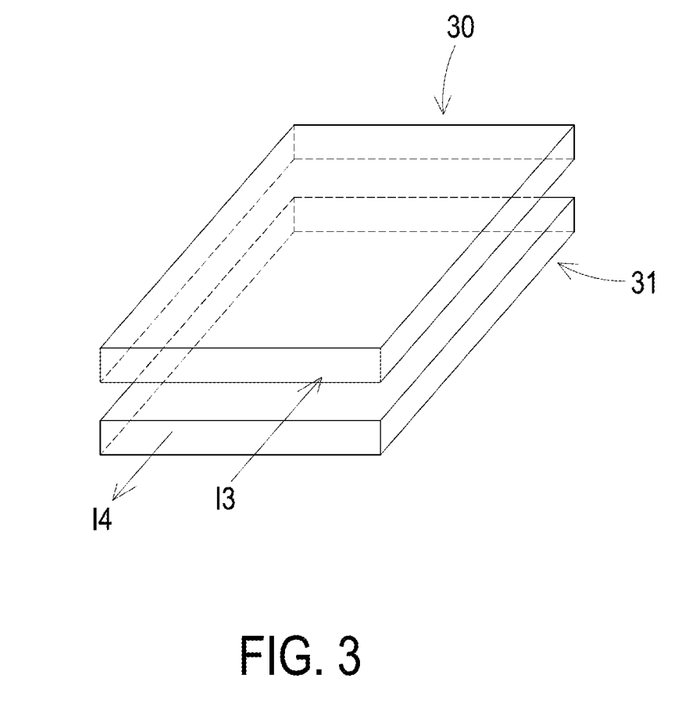
FIG. 3 schematically illustrates the relationship between the first conducting plate and the second conduction plate of the connecting unit of the rectification module according to the first embodiment of the present invention.

FIG. 3 schematically illustrates the relationship between the first conducting plate and the second conduction plate of the connecting unit of the rectification module according to the first embodiment of the present invention. Please refer to FIGS. 1, 2 and 3. In the rectification module 1 of the present invention, the outlet ends 24 of the transformer 2 and the rectification unit 4 are connected with each other through the first conducting plate 30 and the second conducting plate 31 of the connecting unit 3. Moreover, at least a portion of the second conducting plate 31 and at least a portion of the first conducting plate 30 are stacked on each other. During the operations of the rectification module 1, the current 13 flowing through the first conducting plate 30 and the current 14 flowing through the second conducting plate 31 are restricted in the adjacent portions of the first conducting plate 30 and the second conducting plate 31. As mentioned above, the at least a portion of the first conducting plate 30 and the at least a portion of the second conducting plate 31 are stacked on each other. In other words, a portion of the bottom surface of the first conducting plate 30 and a portion of the top surface of the second conducting plate 31 face each other. Consequently, the current 13 flowing through the first conducting plate 30 and the current 14 flowing through the second conducting plate 31 are restricted in the facing portions of the first conducting plate 30 and the second conducting plate 31.

Figure 4:
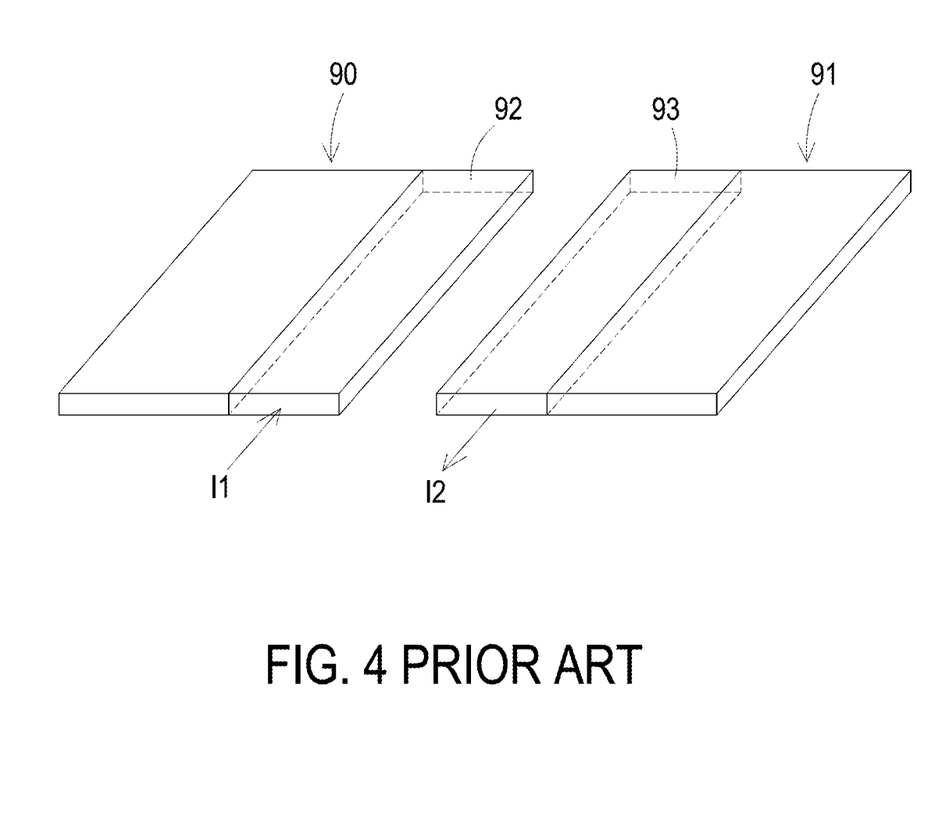
FIG. 4 schematically illustrates the relationship between the first conducting plate and the second conduction plate of the connecting unit of a conventional rectification module.

FIG. 4 schematically illustrates the relationship between the first conducting plate and the second conduction plate of the connecting unit of a conventional rectification module. As shown in FIG. 4, the first conducting plate 90 and the second conduction plate 91 of the connecting unit of the conventional rectification module are in parallel and coplanar with each other. Moreover, the first conducting plate 90 and the second conduction plate 91 are arranged between the transformer (not shown) and the rectification unit (not shown). The current 11 flowing through the first conducting plate 90 is restricted in a first region 92 that is located beside the second conducting plate 91. The current 12 flowing through the second conducting plate 91 is restricted in a second region 93 that is located beside the first conducting plate 90. Since the AC impedance of the connecting unit of the rectification module is increased, the power loss is increased and the efficiency of the rectification module is impaired.

Please refer to FIG. 3 again. As mentioned above, the current 13 flowing through the first conducting plate 30 and the current 14 flowing through the second conducting plate 31 are restricted in the facing portions of the first conducting plate 30 and the second conducting plate 31. Since the AC impedance of the connecting unit 3 of the rectification module 1 is decreased, the power loss is decreased and the efficiency of the rectification module 1 is enhanced. Moreover, the areas of the facing portions of the first conducting plate 30 and the second conducting plate 31 may be determined according to the practical requirements. Consequently, the flexibility of designing the rectification module is enhanced.

In an embodiment, the circuit board 40 of the rectification unit 4 further comprises plural first output parts 42. The plural first output parts 42 are arranged beside the third lateral region 21 of the transformer 2. In an embodiment, the first output parts 42 are protrusion structures. After the plural first output parts 42 are inserted into corresponding conductive holes (not shown) of the main board, the circuit board 40 of the rectification unit 4 is perpendicularly installed on and electrically connected with the main board.

Figure 5:
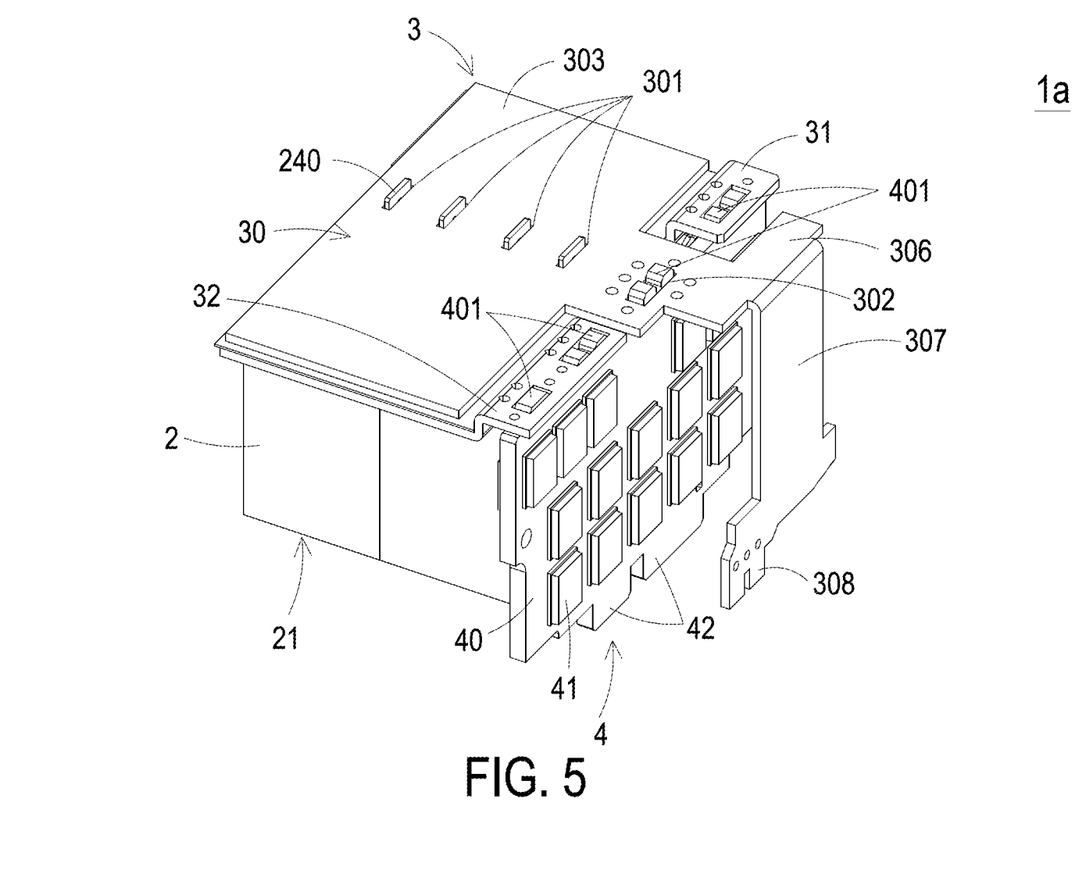
FIG. 5 is a schematic perspective view illustrating a rectification module according to a second embodiment of the present invention.
Figure 6:
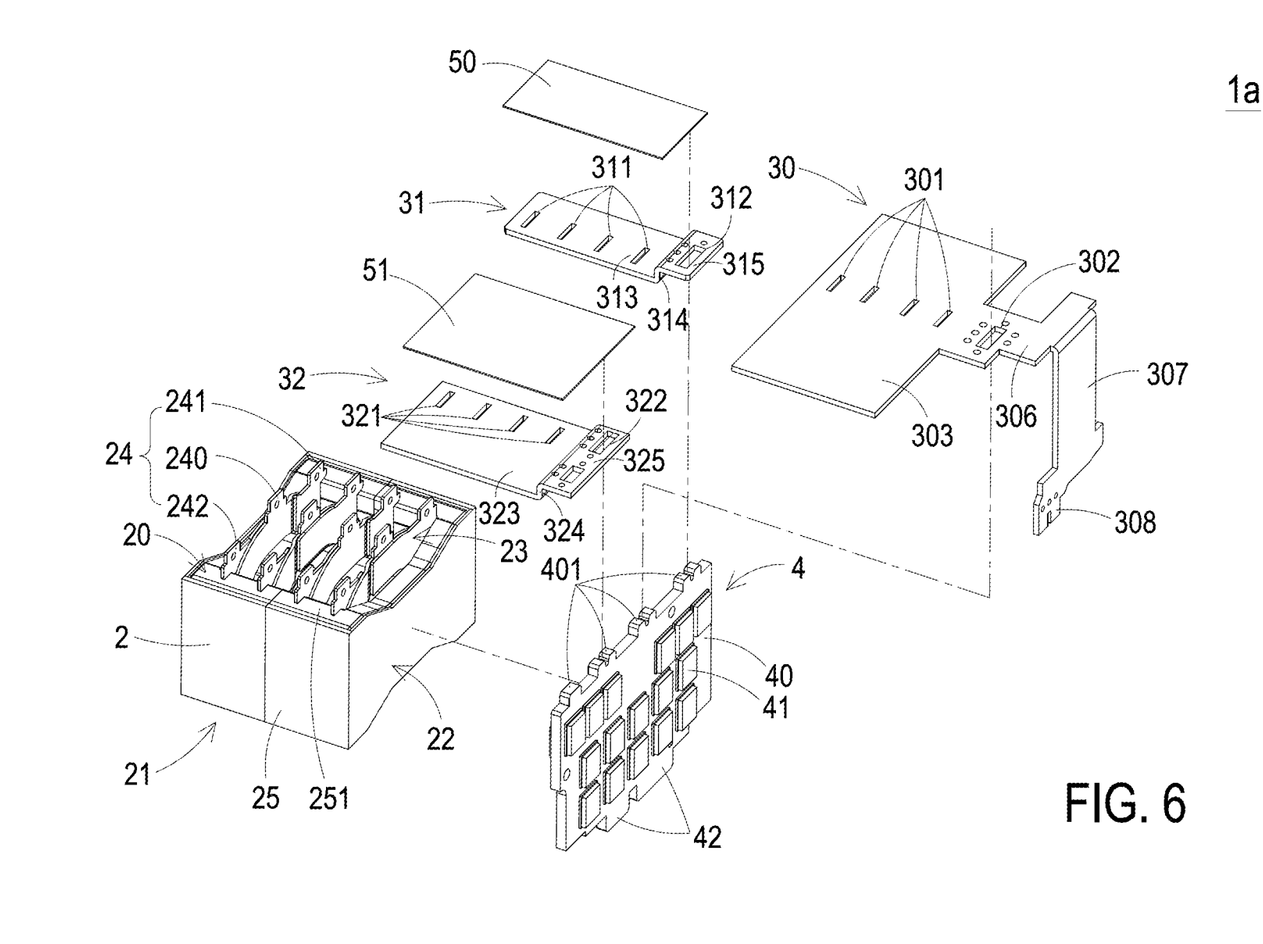
FIG. 6 is a schematic exploded view illustrating the rectification module of FIG. 5.

FIG. 5 is a schematic perspective view illustrating a rectification module according to a second embodiment of the present invention. FIG. 6 is a schematic exploded view illustrating the rectification module of FIG. 5. In this embodiment, the rectification module 1a comprises a transformer 2, a connecting unit 3 and a rectification unit 4. Component parts and elements corresponding to those of the first embodiment are designated by identical numeral references, and detailed descriptions thereof are omitted.

In the rectification module 1a, the plural outlet ends 24 of the secondary winding assembly 23 include a first outlet end 240, a second outlet end 241 and a third outlet end 242. Moreover, the connecting unit 3 of the rectification module 1a further comprises a third conducting plate 32. The third conducting plate 32 is located at the first lateral region 20 of the transformer 2. The third conducting plate 32 is arranged between the transformer 2 and the first conducting plate 30. At least a portion of the third conducting plate 32 and at least a portion of the first conducting plate 30 are stacked on each other. Moreover, the third conducting plate 32 and the second conducting plate 31 are separated from each other by a gap.

The third conducting plate 32 comprises at least one third opening 321 and at least one fourth connecting structure 322. Preferably, the third conducting plate 32 comprises plural third openings 321. The third outlet ends 242 of the secondary winding assembly 23 are received within the corresponding third openings 321 and electrically connected with the third conducting plate 32. It is preferred that the second conducting plate 31 and the third conducting plate 32 are located at the first lateral region 20 of the transformer 2 and coplanar with each other. Consequently, the layout space of the second conducting plate 31 and the third conducting plate 32 on the first lateral region 20 of the transformer 2 will be reduced. Moreover, a portion of the first conducting plate 30 is stacked over the second conducting plate 31, and another portion of the first conducting plate 30 is stacked over the third conducting plate 32. In an embodiment, the first conducting plate 30, the second conducting plate 31 and the third conducting plate 32 are copper bus bars. Alternatively, the first conducting plate 30, the second conducting plate 31 and the third conducting plate 32 are integrally formed into one piece by a copper bus bar (not shown). Moreover, the first connecting structure 302, the second connecting structure 312 and the fourth connecting structure 322 are arranged beside the second lateral region 22 of the transformer 2.

Moreover, the rectification module 1a further comprises a first insulation component 50 and a second insulation component 51. The first insulation component 50 is arranged between the first conducting plate 30 and the second conducting plate 31. For example, the first insulation component 50 is aligned with the stacked position between the first conducting plate 30 and the second conducting plate 31. Consequently, the first conducting plate 30 and the second conducting plate 31 are isolated from each other through the first insulation component 50. The second insulation component 51 is arranged between the first conducting plate 30 and the third conducting plate 32. For example, the second insulation component 51 is aligned with the stacked position between the first conducting plate 30 and the third conducting plate 32. Consequently, the first conducting plate 30 and the third conducting plate 32 are isolated from each other through the second insulation component 51. Moreover, the second conducting plate 31 and the third conducting plate 32 are separated from each other by a gap. Consequently, the second conducting plate 31 and the third conducting plate 32 are isolated from each other. Moreover, the first conducting plate 30, the first insulation component 50 and the second conducting plate 31 are combined together through a gluing medium, and the first conducting plate 30, the second insulation component 51 and the third conducting plate 32 are combined together through the gluing medium. Consequently, the first conducting plate 30, the first insulation component 50, the second conducting plate 31, the second insulation component 51 and the third conducting plate 32 are combined together.

The rectification unit 4 comprises a circuit board 40 and plural rectifier components 41. The circuit board 40 comprises plural third connecting structures 401. The plural third connecting structures 401 are arranged beside the first lateral region 20 of the transformer 2. The plural third connecting structures 401 are connected with the first connecting structure 302 of the first conducting plate 30, the second connecting structure 312 of the second conducting plate 31 and the fourth connecting structure 322 of the third conducting plate 32, respectively. Consequently, the circuit board 40 is fixed on the second lateral region 22 of the transformer 2. The third connecting structures 401 is electrically connected with the first conducting plate 30 through the first connecting structure 302, electrically connected with the second conducting plate 31 through the second connecting structure 312, and electrically connected with the third conducting plate 32 through the fourth connecting structure 322, respectively. The rectifier components 41 are installed on the circuit board 40 and electrically connected with the third connecting structures 401. After the output electric energy from the plural outlet ends 24 of the secondary winding assembly 23 are transmitted to the first conducting plate 30, the second conducting plate 31 and the third conducting plate 32, the output electric energy is transmitted to the rectifier components 41 through the third connecting structures 401. The rectifier components 41 are used for rectification.

In an embodiment, the first connecting structure 302, the second connecting structure 312 and the fourth connecting structure 322 are slots, and the third connecting structures 401 are bulges. After the first connecting structure 302, the second connecting structure 312 and the fourth connecting structure 322 are engaged with the corresponding third connecting structures 401, the circuit board 40 and the connecting unit 3 are combined together. In another embodiment, the first connecting structure 302, the second connecting structure 312 and the fourth connecting structure 322 are bulges, and the third connecting structures 401 are slots. Similarly, after the first connecting structure 302, the second connecting structure 312 and the fourth connecting structure 322 are engaged with the corresponding third connecting structures 401, the circuit board 40 and the connecting unit 3 are combined together.

In an embodiment, the second conducting plate 31 comprises a second main body 313, a second vertical part 314 and a second extension structure 315. The second main body 313 is located at the first lateral region 20 of the transformer 2. The second vertical part 314 is arranged beside the second lateral region 22 of the transformer 2. Moreover, the second vertical part 314 is vertically extended from an edge of the second main body 313. The second extension structure 315 is horizontally extended from a top end of the second vertical part 314 and in the direction away from the second lateral region 22 of the transformer 2. In an embodiment, the third conducting plate 32 comprises a third main body 323, a third vertical part 324 and a third extension structure 325. The third main body 323 is located at the first lateral region 20 of the transformer 2. The third vertical part 324 is arranged beside the third lateral region 22 of the transformer 2. Moreover, the third vertical part 324 is vertically extended from an edge of the third main body 323. The third extension structure 325 is horizontally extended from a top end of the third vertical part 324 and in the direction away from the third lateral region 22 of the transformer 2. The second openings 311 are formed in the second main body 313. The third openings 321 are formed in the third main body 323. The second connecting structure 312 is located at the second extension structure 315. The fourth connecting structure 322 is located at the third extension structure 325. The second main body 313 of the second conducting plate 31 and the third main body 323 of the third conducting plate 32 are coplanar with each other. Moreover, the second main body 313 and the third main body 323 are isolated from each other.

In an embodiment, the first conducting plate 30 further comprises a first main body 303. At least a portion of the first main body 303 is located above the second main body 313 and the third main body 323. Moreover, at least a portion of the first main body 303, at least a portion of the second main body 313 and at least a portion of the third main body 323 are stacked on each other. Preferably, the height of the second vertical part 314 of the second conducting plate 31 and the height of the third vertical part 324 of the third conducting plate 32 are slightly larger than or equal to the thickness of the first main body 303. Consequently, when the first main body 303 is disposed on the second main body 313 and the third main body 323, the space of the first lateral region 20 of the transformer 2 is not obviously occupied. When the first main body 303 is disposed on the second main body 313 and the third main body 323, the first main body 303 is at the same level with the second extension structure 315 and the third extension structure 325, or the first main body 303 is arranged at the level lower than the second extension structure 315 and the third extension structure 325.

In an embodiment, the first conducting plate 30 further comprises a first extension structure. The first extension structure comprises a connection segment 306 and an extension body segment 307. The connection segment 306 is horizontally extended from an edge of the first main body 303 and in the direction away from the second lateral region 22 of the transformer 2. The extension body segment 307 is extended from an edge of the connection segment 306 and in the direction toward the third lateral region 21 of the transformer 2. That is, the extension body segment 307 is located at the second lateral region 22 of the transformer 2 and in parallel with the circuit board 40 of the rectification unit 4. The rectification unit 4 is arranged between the extension body segment 307 of the first conducting plate 30 and the transformer 2. Moreover, the first connecting structure 302 of the first conducting plate 30 is located at the connection segment 306.

The extension body segment 307 of the first conducting plate 30 further comprises a second output part 308. The second output part 308 is arranged beside the third lateral region 21 of the transformer 2. For example, the second output part 308 is a protrusion structure. After the second output part 308 is inserted into a corresponding conductive hole (not shown) of the main board, the extension body segment 307 of the first conducting part 30 is perpendicularly installed on and electrically connected with the main board. When the extension body segment 307 of the first conducting plate 30 and the circuit board 40 of the rectification unit 4 are installed on the main board, the second output part 308 and the first output parts 42 are at the same side of the main board and coplanar with each other.

Figure 7:
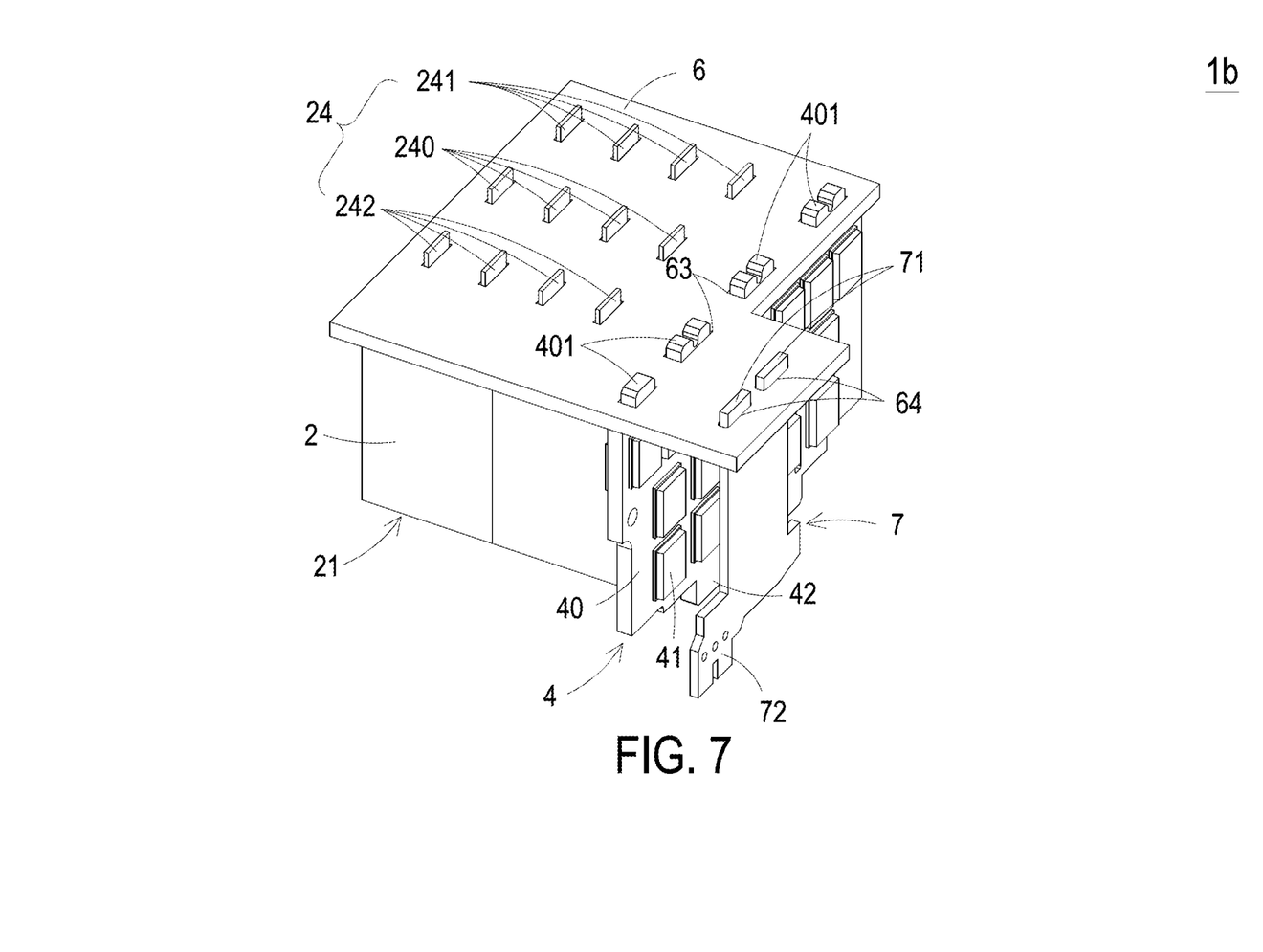
FIG. 7 is a schematic perspective view illustrating a rectification module according to a third embodiment of the present invention.
Figure 8:
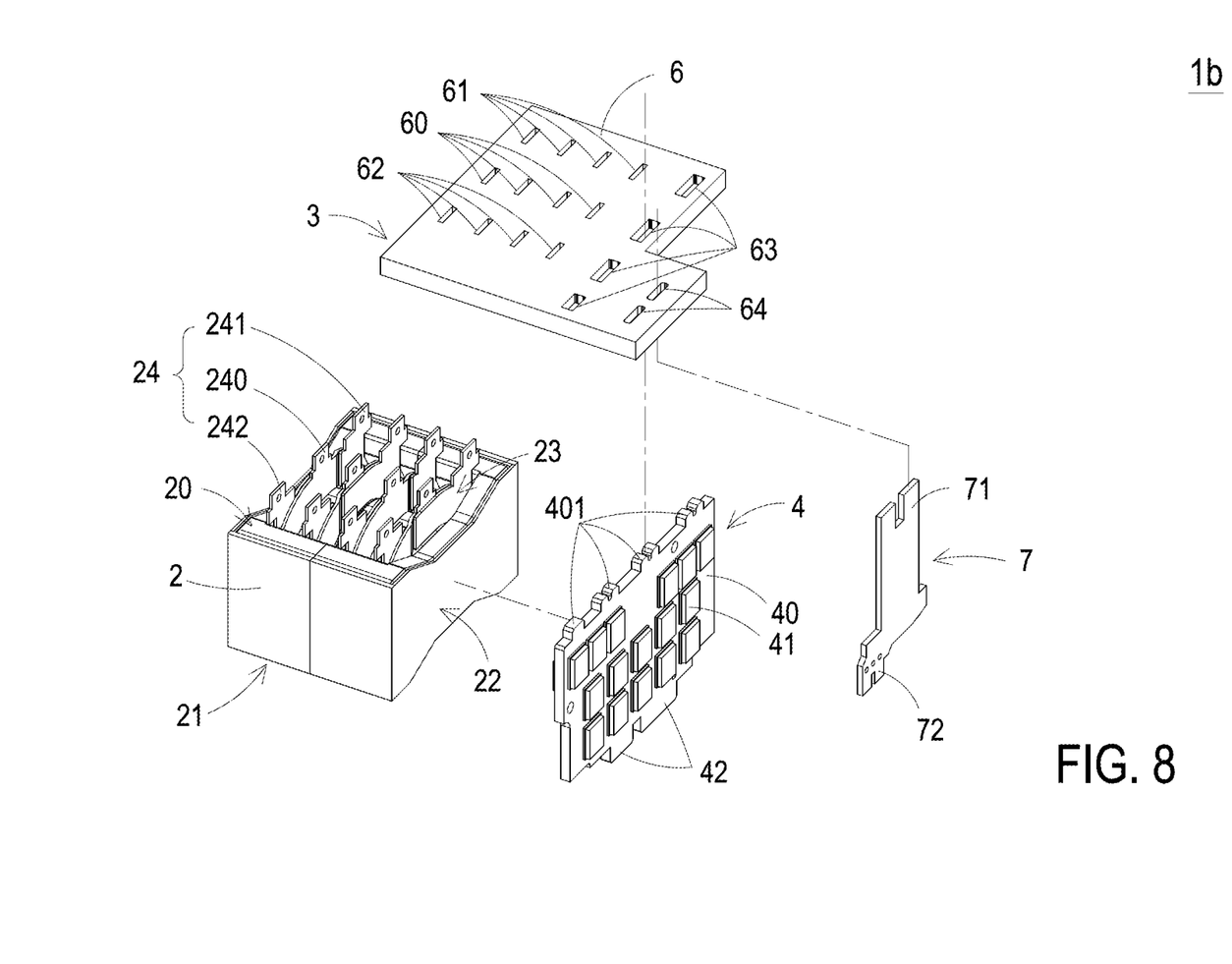
FIG. 8 is a schematic exploded view illustrating the rectification module of FIG. 7.
Figure 9:
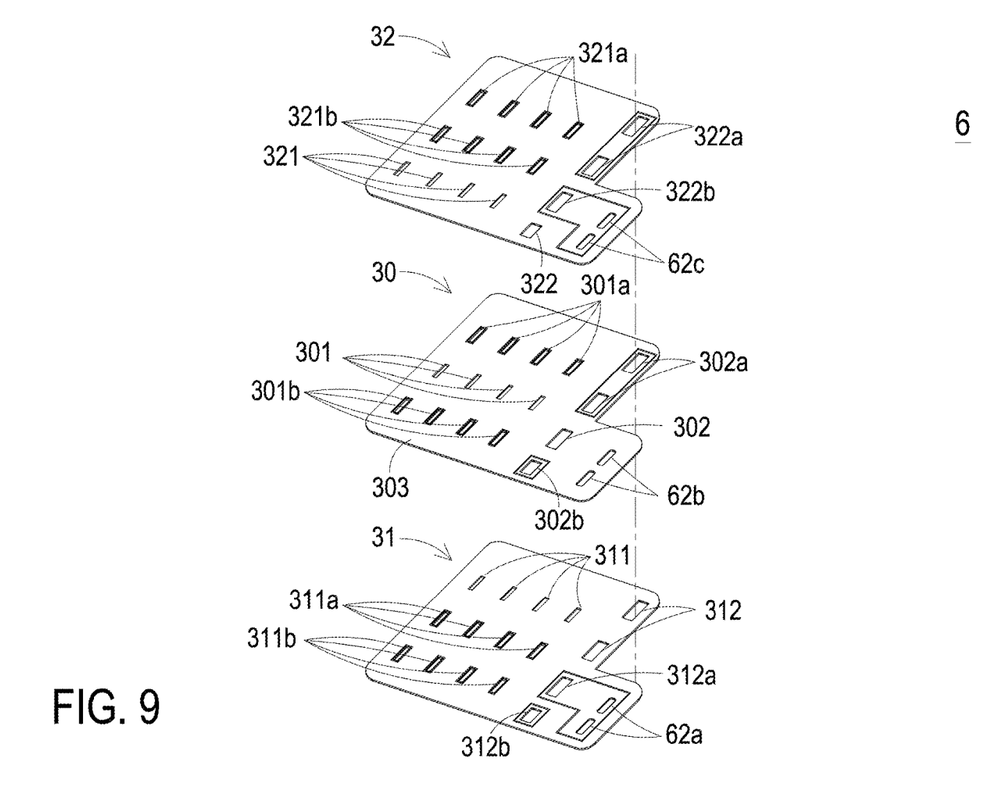
FIG. 9 is a schematic exploded view illustrating the inner structure of the connecting unit of the rectification module as shown in FIG. 7.

FIG. 7 is a schematic perspective view illustrating a rectification module according to a third embodiment of the present invention. FIG. 8 is a schematic exploded view illustrating the rectification module of FIG. 7. FIG. 9 is a schematic exploded view illustrating the inner structure of the connecting unit of the rectification module as shown in FIG. 7. In this embodiment, the rectification module 1b comprises a transformer 2, a connecting unit 3 and a rectification unit 4. Component parts and elements corresponding to those of the second embodiment are designated by identical numeral references, and detailed descriptions thereof are omitted.

In this embodiment, the connecting unit 3 of the rectification module 1b is a printed wiring board 6. The connecting unit 3 is located at the first lateral region 20 of the transformer 2. Moreover, the connecting unit 3 comprises a first conducting plate 30, a second conducting plate 31 and a third conducting plate 32. The first conducting plate 30 is stacked over the second conducting plate 31, and the third conducting plate 32 is stacked over the first conducting plate 30. The second conducting plate 31 and the third conducting plate 32 are separated from each other by a gap.

The printed wiring board 6 comprises electric traces. The first openings 301 and the first connecting structure 302 of the first conducting plate 30 are electrically connected with each other through the corresponding electric traces. Consequently, when the first outlet ends 240 are accommodated within the corresponding first openings 301 of the first conducting plate 30, the first outlet ends 240 is electrically connected with the first connecting structure 302. Similarly, the second openings 311 and the second connecting structure 312 of the second conducting plate 31 are electrically connected with each other through the corresponding electric traces. Consequently, when the second outlet ends 241 are accommodated within the corresponding second openings 311 of the second conducting plate 31, the second outlet ends 241 is electrically connected with the second connecting structure 312. Similarly, the third openings 321 and the fourth connecting structure 322 of the third conducting plate 32 are electrically connected with each other through the corresponding electric traces. Consequently, when the third outlet ends 242 are accommodated within the corresponding third openings 321 of the third conducting plate 32, the third outlet ends 242 is electrically connected with the fourth connecting structure 322.

In an embodiment, the first conducting plate 30 comprises at least one first aligning hole 301a and at least one second aligning hole 301b. Preferably, the first conducting plate 30 comprises plural first aligning holes 301a and plural second aligning holes 301b. The plural first aligning holes 301a and the plural second aligning holes 301b are in parallel with the plural first openings 301. Moreover, the plural first openings 301 are arranged between the plural first aligning holes 301a and the plural second aligning holes 301b. Moreover, the first aligning holes 301a and the second aligning holes 301b are nonconductive. The second conducting plate 31 comprises at least one third aligning hole 311a and at least one fourth aligning hole 311b. Preferably, the second conducting plate 31 comprises plural third aligning holes 311a and plural fourth aligning holes 311b. The plural third aligning holes 311a and the plural fourth aligning holes 311b are in parallel with the plural second openings 311. Moreover, the plural second openings 311 are arranged between the plural third aligning holes 311a and the plural fourth aligning holes 311b. Moreover, the plural third aligning holes 311a and the plural fourth aligning holes 311b are nonconductive. The third conducting plate 32 comprises at least one fifth aligning hole 321a and at least one sixth aligning hole 321b. Preferably, the third conducting plate 32 comprises plural fifth aligning holes 321a and plural sixth aligning holes 321b. The plural fifth aligning holes 321a and the plural sixth aligning holes 321b are in parallel with the plural third openings 321. Moreover, the plural third openings 321 are arranged between the plural fifth aligning holes 321a and the plural sixth aligning holes 321b. Moreover, the plural fifth aligning holes 321a and the plural sixth aligning holes 321b are nonconductive.

In an embodiment, the printed wiring board 6 further comprises plural first through-holes 60, plural second through-holes 61 and plural third through-holes 62. The third aligning holes 311a, the first openings 301 and the sixth aligning holes 321b are aligned with each other and in communication with each other to define the first through-holes 60 collaboratively. The second openings 311, the first aligning holes 301a and the fifth aligning holes 321a are aligned with each other and in communication with each other to define the second through-holes 61 collaboratively. The fourth aligning holes 311b, the second aligning holes 301b and the third openings 321 are aligned with each other and in communication with each other to define the third through-holes 62 collaboratively. When the second conducting plate 31, the first conducting plate 30 and the third conducting plate 32 are stacked on each other, the first outlet ends 240 are penetrated through the corresponding third aligning holes 311a, the corresponding first openings 301 and the corresponding sixth aligning holes 321b, electrically connected with the corresponding first openings 301, and protruded out of the corresponding first through-holes 60. Moreover, the second outlet ends 241 are penetrated through the corresponding second openings 311, the corresponding first aligning holes 301a and the corresponding fifth aligning holes 321a, electrically connected with the corresponding second openings 311, and protruded out of the corresponding second through-holes 61. Moreover, the third outlet ends 242 are penetrated through the corresponding fourth aligning holes 311b, the corresponding second aligning holes 301b and the corresponding third openings 321, electrically connected with the corresponding third openings 321, and protruded out of the corresponding third through-holes 62.

In an embodiment, the printed wiring board 6 further comprises plural main connecting structures 63. When the second conducting plate 31, the first conducting plate 30 and the third conducting plate 32 are stacked on each other, the first connecting structures 302, the corresponding second connecting structures 312 and the corresponding fourth connecting structures 322 are aligned with each other to define main connecting structures 63 collaboratively. The main connecting structures 63 are electrically connected with the corresponding third connecting structures 401.

In an embodiment, the printed wiring board 6 further comprises plural receiving parts 64. When the second conducting plate 31, the first conducting plate 30 and the third conducting plate 32 are stacked on each other, first receiving structures 62b of the first conducting plate 30, second receiving structures 62a of the second conducting plate 31 and third receiving structures 62c of the third conducting plate 32 are aligned with each other to define the plural receiving parts 64 collaboratively. The first conducting plate 30 comprises a first main body 303 and a coupling element 7. The receiving parts 64 are arranged beside the second lateral region 22 of the transformer 2. The coupling element 7 is arranged beside the second lateral region 22 of the transformer 2. Moreover, the coupling element 7 comprises plural insertion parts 71. For example, the insertion parts 71 are protrusion structures. The insertion parts 71 are arranged beside the first lateral region 20 of the transformer 2. After the insertion parts 71 are inserted into the corresponding receiving parts 64, the first main body 303 of the first conducting plate 30 and the coupling element 7 of the first conducting plate 30 are combined together. Consequently, the coupling element 7 is perpendicularly on the first main body 303 and arranged beside the circuit board 40 of the rectification unit 4.

In an embodiment, the coupling element 7 further comprises a third output part 72. The third output part 72 is a protrusion structure. Moreover, the third output part 72 is arranged beside the third lateral region 21 of the transformer 2. After the third output part 72 is inserted into a corresponding conductive hole (not shown) of the main board, the coupling element 7 of the connecting unit 3 is perpendicularly installed on and electrically connected with the main board. When the coupling element 7 of the connecting unit 3 and the circuit board 40 of the rectification unit 4 are installed on the main board, the third output part 72 of the coupling element 7 of the connecting unit 3 and the first output part 42 of the circuit board 40 of the rectification unit 4 are located at the same side of the main board and coplanar with each other.

From the above descriptions, the present invention provides the rectification module. The connecting unit is located at the first lateral region of the transformer. The connecting unit is electrically connected with the rectification unit and the transformer. Moreover, the rectification unit is fixed on the second lateral region of the transformer with the assistance of the connecting unit. In other words, the connecting unit and the rectification unit are disposed on the periphery regions of the transformer. Consequently, the transformer, the connecting unit and the rectification unit are combined as an integrated structure. As mentioned above, the connecting unit, the transformer and the rectification unit of the conventional rectification module are individually and separately disposed on the main board. When compared with the conventional rectification module, the volume of the rectification module of the present invention is smaller. Moreover, when the rectification module of the present invention is installed on the main board, the power density of the main board is enhanced. Moreover, since the AC impedance of the connecting unit of the rectification module is decreased, the power loss is decreased and the efficiency of the rectification module is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A rectification module, comprising:
   a transformer comprising a first lateral region, a second lateral region and at least one secondary winding assembly, wherein the second lateral region is located beside the first lateral region, the at least one secondary winding assembly comprises plural outlet ends, and the plural outlet ends are arranged near the first lateral region; and
   a connecting unit located at the first lateral region, and comprising a first conducting plate and a second conducting plate, wherein the first conducting plate comprises at least one first opening and at least one first connecting structure, and one of the plural outlet ends is accommodated within the first opening, wherein at least a portion of the second conducting plate and at least a portion of the first conducting plate are stacked on each other, the second conducting plate comprises at least one second opening and at least one second connecting structure, and said one of the plural outlet ends is accommodated within the second opening, wherein the first conducting plate and the second conducting plate are fixed on the first lateral region, the first conducting plate and the second conducting plate are electrically isolated from each other, and the first connecting structure and the second connecting structure face the second lateral region.

2. The rectification module according to claim 1, wherein the rectification module further comprises a rectification unit having a circuit board and plural rectifier components, wherein the circuit board comprises plural third connecting structures, and the third connecting structures are arranged beside the first lateral region and respectively connected with the first connecting structure and the second connecting structure, so that the circuit board is fixed on the second lateral region.

3. The rectification module according to claim 1, wherein the rectification module further comprises a first insulation component arranged between the first conducting plate and the second conducting plate.

4. The rectification module according to claim 2, wherein the first connecting structure and the second connecting structure are slots and the corresponding third connecting structures are bulges, or the first connecting structure and the second connecting structure are bulges and the corresponding third connecting structures are slots.

5. The rectification module according to claim 2, wherein the rectification module further comprises a third conducting plate, wherein at least a portion of the third conducting plate and at least a portion of the first conducting plate are stacked on each other, and the first conducting plate and the third conducting plate are isolated from each other, wherein the third conducting plate comprises at least one third opening and at least one fourth connecting structure, the corresponding outlet end is accommodated within the third opening, and the fourth connecting structure is arranged beside the second lateral region.

6. The rectification module according to claim 5, wherein at least a portion of the third conducting plate and at least a portion of the second conducting plate are stacked on each other.

7. The rectification module according to claim 2, wherein the circuit board further comprises plural first output parts, and the plural first output parts are arranged beside a third lateral region of the transformer.

8. The rectification module according to claim 5, wherein the first conducting plate, the second conducting plate and the third conducting plate are copper bus bars.

9. The rectification module according to claim 5, wherein the rectification module further comprises a first insulation component and a second insulation component, wherein the first insulation component is arranged between the first conducting plate and the second conducting plate, and the second insulation component is arranged between the first conducting plate and the third conducting plate.

10. The rectification module according to claim 5, wherein the first connecting structure, the second connecting structure and the fourth connecting structure are slots and the corresponding third connecting structures are bulges, or the first connecting structure, the second connecting structure and the fourth connecting structure are bulges and the corresponding third connecting structures are slots.

11. The rectification module according to claim 5, wherein the second conducting plate and the third conducting plate are located at the first lateral region of the transformer and coplanar with each other, wherein at least a portion of the first conducting plate is stacked over the second conducting plate and the third conducting plate.

12. The rectification module according to claim 11, wherein the second conducting plate and the third conducting plate are separated from each other by a gap.

13. The rectification module according to claim 12, wherein the second conducting plate comprises a second main body, a second vertical part and a second extension structure, wherein the second vertical part is vertically extended from an edge of the second main body, and the second extension structure is extended from a top end of the second vertical part and in the direction away from the second lateral region of the transformer, wherein the third conducting plate comprises a third main body, a third vertical part and a third extension structure, wherein the third vertical part is vertically extended from an edge of the third main body, and the third extension structure is extended from a top end of the third vertical part and in the direction away from the second lateral region of the transformer.

14. The rectification module according to claim 13, wherein the at least one second opening is formed in the second main body, the at least one third opening is formed in the third main body, the second connecting structure is located at the second extension structure, and the fourth connecting structure is located at the third extension structure.

15. The rectification module according to claim 14, wherein the first conducting plate further comprises a first main body, wherein at least a portion of the first main body is stacked over the second main body and the third main body.

16. The rectification module according to claim 15, wherein a height of the second vertical plate and a height of the third vertical part are larger than or equal to a thickness of the first main body.

17. The rectification module according to claim 15, wherein the first conducting plate further comprises a connection segment and an extension body segment, wherein the connection segment is extended from an edge of the first main body and in a direction away from the second lateral region of the transformer, the extension body segment is extended from the connection segment and in a direction toward a third lateral region of the transformer.

18. The rectification module according to claim 17, wherein the first connecting structure is located at the connection segment of the first conducting plate.

19. The rectification module according to claim 17, wherein the extension body segment of the first conducting plate further comprises a second output part, wherein the second output part is arranged beside the third lateral region of the transformer.

20. The rectification module according to claim 5, wherein the second conducting plate is located at the first lateral region of the transformer, the first conducting plate and the second conducting plate are aligned with each other, and the third conducting plate and the first conducting plate are aligned with each other.

21. The rectification module according to claim 20, wherein the plural outlet ends of the secondary winding assembly include a first outlet end, a second outlet end and a third outlet end, wherein the first outlet end is contacted with and electrically connected with the first conducting plate, the second outlet end is contacted with and electrically connected with the second conducting plate, and the third outlet end is contacted with and electrically connected with the third conducting plate.

22. The rectification module according to claim 1, wherein the connecting unit is a printed wiring board with the first conducting plate and the second conducting plate.

23. The rectification module according to claim 5, wherein the connecting unit is a printed wiring board with the first conducting plate, the second conducting plate and the third conducting plate.

24. The rectification module according to claim 2, wherein the first conducting plate further comprises a coupling element, and the coupling element is connected with a first main body of the first conducting plate, wherein the coupling element further comprises a third output part, and the third output part is coplanar with a first output part of the circuit board.

25. The rectification module according to claim 1, wherein the first conducting plate and the second conducting plate are integrally formed into one piece by a copper bus bar.

26. The rectification module according to claim 5, wherein the first conducting plate, the second conducting plate and the third conducting plate are integrally formed into one piece by a copper bus bar.

* * * * *